(12) United States Patent
Gross

(10) Patent No.: US 7,961,000 B1
(45) Date of Patent: Jun. 14, 2011

(54) IMPEDANCE MATCHING CIRCUIT AND METHOD

(75) Inventor: Eric Wolf Gross, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 670 days.

(21) Appl. No.: 11/193,791

(22) Filed: Jul. 29, 2005

Related U.S. Application Data

(60) Provisional application No. 60/606,194, filed on Sep. 1, 2004.

(51) Int. Cl.
*H03K 17/16* (2006.01)
(52) U.S. Cl. ............... 326/30; 326/82; 326/83; 326/86; 327/108; 327/109
(58) Field of Classification Search .............. 326/30, 326/21, 26, 81–83, 86–87, 38–40; 327/108–109
See application file for complete search history.

(56) References Cited

U.S. PATENT DOCUMENTS

| | | | | |
|---|---|---|---|---|
| 5,134,311 A | * | 7/1992 | Biber et al. | 327/108 |
| 5,578,940 A | * | 11/1996 | Dillon et al. | 326/30 |
| 5,751,161 A | * | 5/1998 | Wei et al. | 326/30 |
| 6,044,417 A | * | 3/2000 | Muljono et al. | 710/52 |
| 6,307,424 B1 | * | 10/2001 | Lee | 327/530 |
| 6,480,021 B2 | * | 11/2002 | Deas et al. | 326/30 |
| 6,624,659 B1 | * | 9/2003 | Abraham et al. | 326/82 |
| 7,038,486 B2 | * | 5/2006 | Aoyama et al. | 326/30 |
| 7,119,549 B2 | * | 10/2006 | Lee et al. | 324/601 |
| 2002/0057102 A1 | * | 5/2002 | Kim | 326/30 |
| 2003/0231523 A1 | * | 12/2003 | Cho et al. | 365/189.05 |

* cited by examiner

*Primary Examiner* — James H. Cho
*Assistant Examiner* — Christopher Lo

(57) ABSTRACT

An impedance matching circuit has a number of buffers each having a variable impedance circuit. A variable impedance sense control block has an impedance code as an output. A sequencing circuit couples the impedance code of the variable impedance sense control block to the variable impedance circuit of each of the buffers.

15 Claims, 7 Drawing Sheets

| | | Integral Bits | Large Fractional Bits | Small Fractional Bit | Change (# legs) | Mismatch (# legs) |
|---|---|---|---|---|---|---|
| Original State | Data | 0 | 1 | 1 | 0 | 0 |
| | Clock | 0 | 1 | 1 | 0 | |
| Old Worst Case — 100 | Data | 1 | 1 | 1 | +1 | 1.75 |
| | Clock | 0 | 0 | 0 | -0.75 | |
| Possible Intermediate States (under new scheme) | Data | 0 | 1 | 1 | 0 | 0.25 |
| | Clock | 1 | 0 | 0 | +0.25 | |
| | Data | 0 | 1 | 1 | 0 | 0.5 |
| | Clock | 1 | 0 | 1 | +0.5 | |
| | Data | 0 | 0 | 1 | -0.5 | 0.5 |
| | Clock | 0 | 1 | 1 | 0 | |
| | Data | 0 | 0 | 1 | -0.5 | 0.75 |
| | Clock | 1 | 0 | 0 | +0.25 | |
| | Data | 0 | 0 | 1 | -0.5 | 1 — 102 |
| | Clock | 1 | 0 | 1 | +0.5 | |

FIG. 4

IMPEDANCE MATCHING CIRCUIT AND METHOD

RELATED APPLICATIONS

The present invention claims priority on provisional patent application Ser. No. 60/606,194, filed on Sep. 1, 2004, entitled "Circuit for minimizing skew introduced by variable impedance sense code updates" and is hereby incorporated by reference.

FIELD OF THE INVENTION

The present invention relates generally to the field of electronic circuits and more particularly to an impedance matching circuit and method.

BACKGROUND OF THE INVENTION

Impedance mismatch between transmission lines and driver/receiver impedances can cause signal reflections and may degrade the signal. One solution to the problem of mismatch between transmission lines and driver/receiver impedances has been to add a programmable impedance matching circuit to an input/output (I/O) buffer between the transmitter or receiver and the transmission line. The circuit includes an external resistor (RQ), a variable impedance sense control block, and an on-die pull-up (PU) array and pull-down (PD) array impedances (not shown) in the I/O buffers. The I/O buffer impedance is controlled by a digital code generated by the variable impedance sense control block. Generally, the variable impedance sense control block senses the mismatch between the on- and off-chip resistances then generates a code for the I/O buffers which minimizes the mismatch. The code updates are transmitted directly from the variable impedance sense control block to the I/O buffers.

Although this is an improvement over the prior buffers that lacked dynamic impedance matching circuits, the above approach is not wholly satisfactory for a number of reasons. One disadvantage with the above approach is all buffers may not see dynamic updates to the variable impedance sense code simultaneously due to propagation delays. The conventional approach for variable impedance sense code update timing is shown in FIG. 1. The variable impedance sense (VIS) control block 10 generates pull-up and pull-down codes to match the off-chip resistor 12 and the I/O buffers impedances. As the code changes, those changes propagate directly from the variable impedance sense control block 10 to all the I/O buffers 14, 16, 18.

The code updates arise from processes that are slow compared to the clock 20 and data 22, 24 frequencies, such as changes in impedance due to on-chip thermal variations. The code updates will therefore often consist of a change in the finest resolution made available by the code bits. If an increment (or decrement) of the code by such a resolution requires the combination of an increment (or decrement) or a larger resolution and a decrement (or increment) of another resolution (e.g., +0.25=−0.75+1), and if the different parts of this combination of changes can occur in a different order for different output buffers, and if the output buffers are transitioning when some but not all of the different parts of the combination of changes have occurred, the skew is introduced between the clock and data line.

The timing waveforms in FIG. 2 illustrate the worst case situation that may arise. In this example, the two "fraction bits" 26, 28 control one half of a leg (bit 1) 30 and one quarter of a leg (bit 0) 32, while the "integral bits" 34, 36 control entire legs. In this example the update consists of a quarter-leg increase, implement by a decrease of 0.75 legs, combined with an increase in one leg of the pull-up or pull-down array. The clock 20 and data 22 transitions occur part way through the update, with the data buffers only receiving the 0.75 leg decrease and the clock buffer only receiving the one leg increase. A 1.75 leg impedance mismatch ensues, which introduces skew 38.

Thus there exists a need for a circuit and method of dynamically updating the variable impedance sense code to the I/O buffers that improves accuracy and minimizes the worst case clock-to-data skew that may be induced by this update.

SUMMARY OF INVENTION

The present invention provides a solution to these and other problems, and offers further advantages over conventional impedance matching circuits and methods of operating the same.

In one aspect, the present invention is directed to a circuit for matching impedance between a number of Input/Output (I/O) buffers and a number of transmission lines. Generally, the circuit includes a Variable Impedance Sense (VIS) block to sense an impedance mismatch between the I/O buffers and the transmission lines, and to generate a multi-bit VIS code to minimize the mismatch. A number of sets of flip-flops (FFs), each set of FFs including a number of FFs, transfer one bit of the VIS code to the each of the I/O buffers through one of the FFs. The VIS block is coupled to each of the FFs through a signal path configured to couple an update clock or pulse to each of the FFs to transfer the VIS code to the I/O buffers.

Usually, the number of FFs in each set of FFs is at least equal to the number of bits in the VIS code, and the number of sets of FFs is at least equal to the number of I/O buffers.

In a preferred embodiment, the circuit further includes a number of delay elements in the signal path between the VIS block and the FFs in at least two of the sets of FFs. The delay elements are arranged in chains or series pairs of two delay elements each such that: the update pulse signal to each FF in a first set of FFs is undelayed; the update pulse to each FF in a second set of FFs is delayed by one delay element in a chain of two delay elements; and the update pulse to each FF in a third set of FFs is delayed by both delay elements in the chain.

In one version of the above embodiment, the VIS code includes at least one integral bit, a largest fractional bit and a smallest fractional bit, and the delay elements are arranged and the sets of FFs configured such that these bits are transferred to the I/O buffers in a specific order. More preferably, the delay elements are arranged and the sets of FFs configured such that these bits are transferred to the I/O buffers in the following order: largest fractional bit first; then at least one integral bit second; and the smallest fractional bit last.

The circuit of the present invention is particularly useful where the number of I/O buffers include at least one data I/O buffer and at least one clock I/O buffer to reduce clock-to-data skew.

In another aspect, the present invention is directed to a method of matching impedance between I/O buffers, including clock and data buffers, and transmission lines coupled thereto, which reduces clock-to-data skew between the at least one I/O buffer and at least one clock I/O buffer. Generally, the method involves: (i) sensing an impedance mismatch between the I/O buffers and the transmission lines; (ii) generating a VIS code to minimize the mismatch, the VIS code having multiple bits including a largest fractional bit, at least one integral bit and a smallest fractional bit; and (iii) transferring bits of the VIS code to the I/O buffers in the following order: largest fractional bit first; the at least one integral bit second; and the smallest fractional bit last.

BRIEF DESCRIPTION OF THE DRAWINGS

FIG. 4 is a table contrasting worst-case values for data-to-clock skew with the conventional circuit of FIG. 1 with the calculated values for the inventive circuit of FIG. 3;

DETAILED DESCRIPTION OF THE DRAWINGS

The present invention is directed to a system or circuit and a method of operating the same to reduce or minimize worst-case timing skew (Tskew) introduced between clock and data at the I/O level during updates of the variable impedance sense (VIS) code to input-output (I/O) buffers.

Skew directly affects the data valid window, and therefore has a large impact on high-speed I/O buffer timing. Reducing skew is difficult, and every pico-second helps. The conventional or prior art circuit and method for providing variable impedance sense code updates leaves the I/O vulnerable to more skew than necessary during updates.

A circuit and method according to an embodiment of the present invention, will now be described in greater detail with reference to FIGS. 3 and 4. For purposes of clarity, many of the details of high speed buffers in general and methods and architectures of impedance matching circuits for the same are described in FIG. 5.

Figure 3:
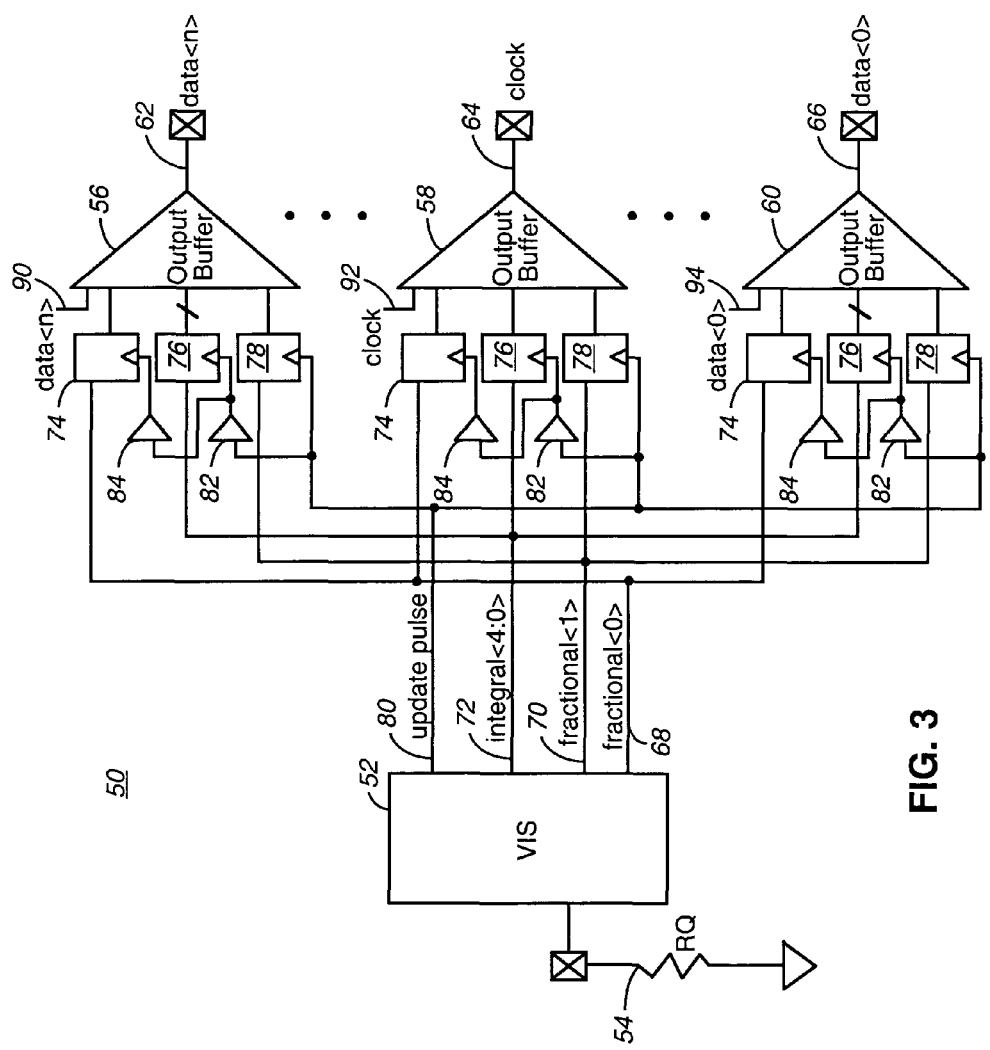
FIG. 3 is a block diagram of an impedance match circuit in accordance with one embodiment of the invention.

FIG. 3 shows an embodiment of circuit 50 for updating of variable impedance sense code to I/O buffers according to an embodiment of the present invention. The circuit 50 has a variable impedance sense control block 52 coupled to an external resistor (RQ) 54. The impedance 54 is compared to the pull-up and pull-down impedances of the output buffers 56, 58, 60 in order to minimize the impedance mismatch between the I/O buffers 56, 58, 60 and the transmission lines 62, 64, 66. The variable impedance sense control block 52 has three (or more) code lines 68, 70, 72. The code transmission line 68 is the smallest fractional leg line. The code transmission line 70 is the largest fractional leg line. And the code transmission line 72 is the integral leg line. Commonly, there will be several integral leg transmission lines and there may be more than two fractional leg transmission lines. All the code transmission lines are coupled to all the I/O buffers 56, 58, 60.

The smallest fractional leg line 68 is coupled to flip flops 74. The largest fractional leg line 70 is coupled to flip flops 78. The integral leg line 72 is coupled to flip flops 76. The variable impedance sense control block 52 also has an update pulse output 80. The update pulse output 80 is coupled to the clock input of flip flops 78. In addition, the update pulse output 80 is coupled to delay elements 82 which may be a pair of inverters. The output of the delay elements 82 is coupled to second delay elements 84. The output of delay elements 82 are also coupled to the clock inputs of flip flops 76. The output of the delay elements 84 are coupled to the clock inputs of flip flops 74. The flip flops 74, 76, 78 and the delay elements 82, 84 ensure that the largest fractional leg code 70 is updated first, the integral leg code(s) 72 are updated second and the smallest fractional leg lines 68 are update last. Note that leg is an impedance leg of a pull-up or pull-down array. The increase or decrease in the impedance may be in integer steps or fractions of the integer steps.

Note that the I/O buffer 56 is buffering a data signal 90, I/O buffer 58 is buffering a clock signal 92 and the I/O buffer 94 is buffering a data signal 94.

The invention introduces a synchronizing and ordering step, which reduces the worst-case impedance mismatch that can otherwise occur between clock and data buffers, thereby reducing the worst-case skew introduced. The synchronization uses a flip-flop near the I/O buffer for every code bit going to it, as well as some simple delay elements to ensure that code updates occur in a certain order. Also, it has the variable impedance sense code supply an update pulse when all the code bits have settled.

The impedance matching circuit and method of the present invention has a flip-flop per code bit per I/O buffer, plus two delay elements (even sets of inverters) per I/O buffer. When the variable impedance sense has completed the code change and the new code bits have settled for some period of time, it then sends an update clock pulse. The original pulse, a once-delayed version of the pulse, and a twice-delayed version of the pulse then serve as clock inputs to the flip-flops, guaranteeing a specific update order. If the clock or data transition during this update, the worst-case skew introduced will be smaller than earlier designs.

In an alternative embodiment of the present invention, the impedance matching circuit would be constructed to simply delay the code bits using buffers or longer wire traces, thereby achieving a similar ordering effect. This would be much less costly from an area perspective, but might also be less robust than the preferred embodiment described above as the timing would not be as well constrained. It would also require more design work, such as an impedance matching circuit as each wire would need to be custom designed to ensure proper timing.

The advantages of the impedance matching circuit of the present invention over previous or conventional approaches include decreasing the worst-case impedance mismatch that can occur between I/O buffers during code updates, which translates to a reduction in the worst-case skew that can be introduced by a code update. FIG. 4 illustrates this by showing all possible cases of mismatch that can occur between I/O buffers during code updates. As can be seen in FIG. 4 the previous circuit may have an impedance mismatch of up to 1.75 legs. The worst case for present invention is one leg. As a result, the clock to data skew will be less when the variable impedance sense code is being updated.

It will be appreciated that it is the guaranteed bit-wise ordering of updates in the impedance code, and the specific ordering that minimizes the worst-case skew potentially introduced by the update.

Figure 2:
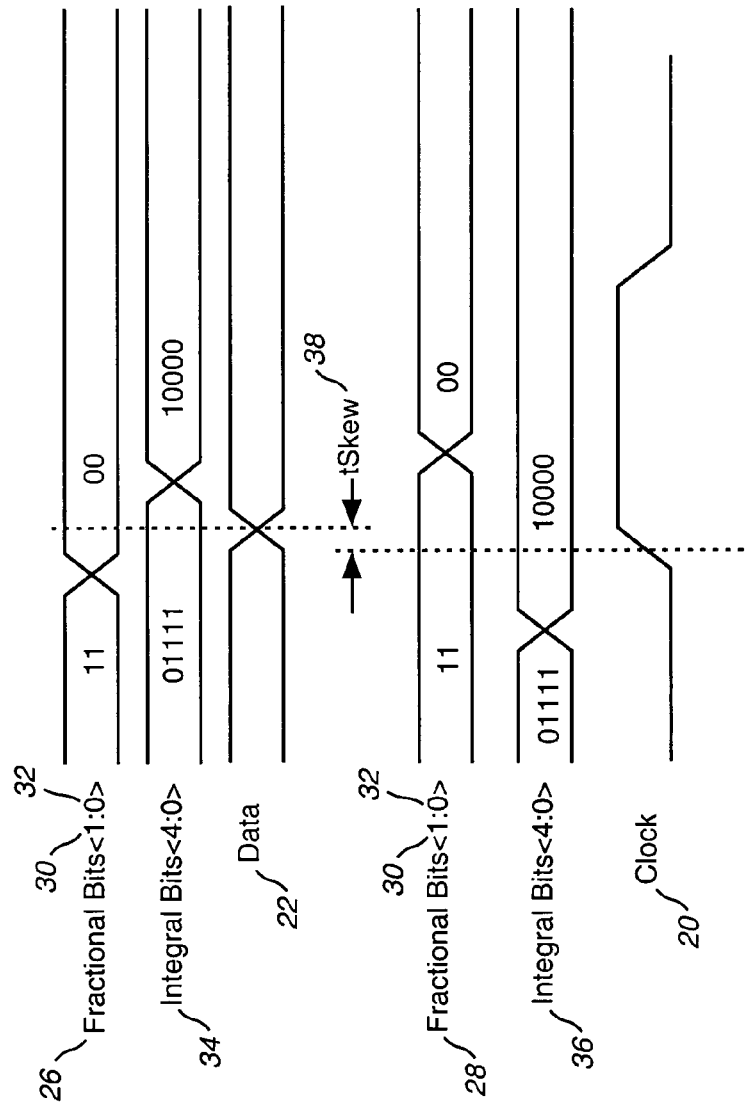
FIG. 2 is an example timing diagram of the prior art impedance matching circuit of FIG. 1.

It will also be appreciated that impedance matching circuit and method of the present invention is particularly useful in high-speed I/O buffers whose data and clock are edge-aligned, and where the skew specification is very difficult to meet. If the data and clock are center-aligned, the timing waveforms shown in FIG. 2 are less likely to occur.

Figure 5:
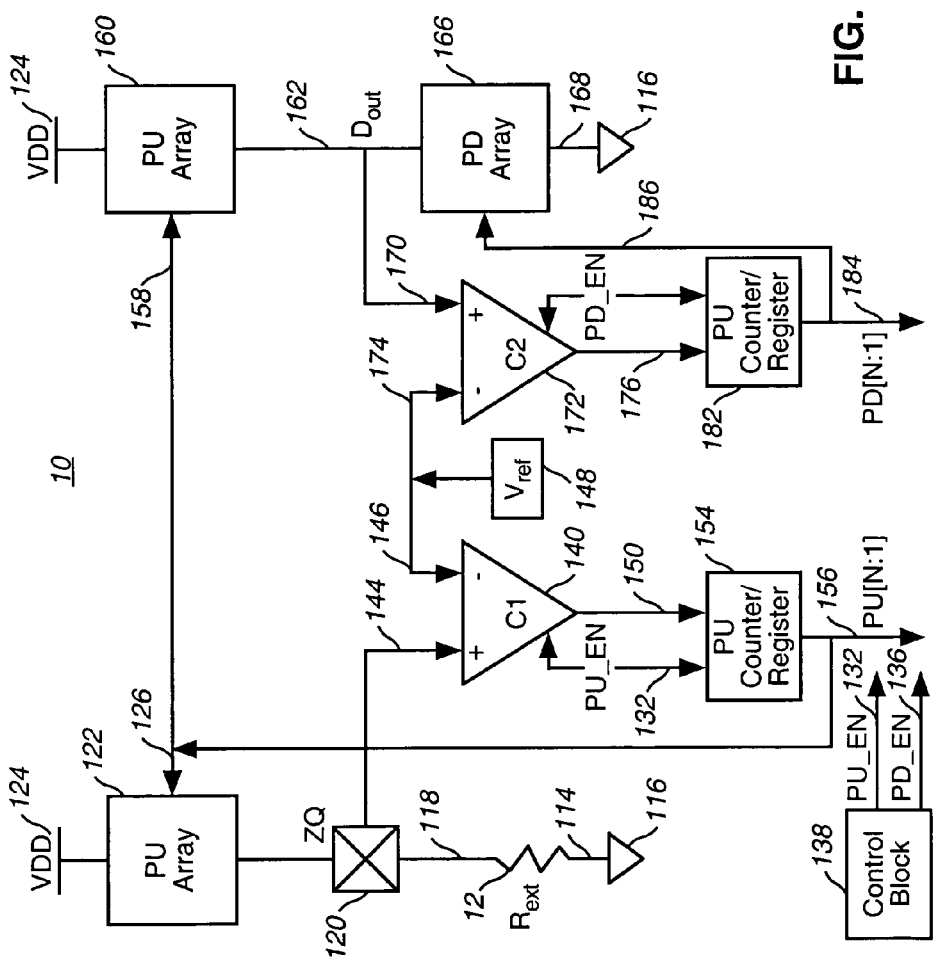
FIG. 5 is a block diagram of a variable impedance sense control block in accordance with one embodiment of the invention.

FIG. 5 is a block diagram of a variable impedance sense control block 10 in accordance with one embodiment of the invention. The control block 10 has a reference or calibration impedance 12 that may be a resistor. This resistor 12 has a first terminal 114 coupled to a ground 116 and a second terminal 118 electrically coupled to a pad 120 or first node. The first node 120 is coupled to a pull-up (PU) array 122 and the pull-up array 122 is coupled to a power supply voltage (VDD) 124. The pull-up array 122 has a control input 126. The pull-up array 122 and reference impedance 12 form a first leg of the impedance control block 10.

The first node 120 is coupled to the positive input 144 of the comparator 142. The negative input 146 of the comparator 140 is coupled to a reference voltage (Vref) 148. The output 50 of the comparator 140 is coupled to a pull-up counter/register 154. The counter/register 154 has a control input 132 and a pull-up output 156. The output 156 is coupled to the control input 126 of the pull-up array 122 and the control input 158 of a second pull-up array 160. The control signals 132 & 136 are generated by a control block 138. The pull-up enable signal 132 enables the first comparator 140 and the pull-up counter register 154.

The second pull-up array 160 has a first terminal coupled to the supply voltage 124 and a second terminal 162 coupled through to a pull-down (PD) array 166. The pull-down array 166 has a second terminal 168 coupled to ground 116. The second terminal 162 of the second pull-up array 160 is coupled to a positive input 170 of a second comparator 172. The negative input 174 of the second comparator 172 is coupled to the reference voltage 148.

The output 176 of the second comparator 172 is coupled to a pull-down counter/register 182. The output 184 of the pull-down counter/register 182 is coupled to the control input 186 of the pull-down array 166. The second pull-up array 160 and the pull-down array 166 form a second leg of the impedance control block 10.

Initially, the first leg is enabled while the second leg is disabled by the control signals 132, 136. The output 150 of the comparator 142 is coupled to the pull-up counter/register 154. Every time the comparator 142 finds a difference in the voltage on its positive input 144 and its negative input 146, the pull-up counter/register 154 is incremented or decremented. This turns off or on fingers in the pull-up array 122 which changes the impedance of the pull-up array 122. The pull-up array 22 is described in more detail with respect to FIG. 6. This process continues until the impedance of the pull-up array 122 equals the impedance of the calibration impedance 12 or the output 150 is essentially zero volts. The corresponding n-bit word is stored in the pull-up register 154.

Once the pull-up array bits are stored in the pull-up register 154, the pull-down loop is activated. The output 176 of the second comparator 172 is coupled to the pull-down counter/register 182. Every time the comparator 172 finds a difference in the voltage on its positive input 170 and its negative input 174, the pull-down counter/register 182 is incremented or decremented. This turns on or off fingers in the pull-down array 166 which changes the impedance of the pull-down array 166. The pull-down array 66 is described in more detail with respect to FIG. 7. This process continues until the impedance of the pull-down array 166 equals the impedance of the second pull-up array 160. The corresponding n-bit word is stored in the pull-down register 182. Note that in one embodiment the reference voltage 148 is one half the supply voltage.

This impedance control block 10 is modified to have an update pulse line 80 for the present invention. The update pulse line will only pulse once the pull-up counter/register 154 and the pull-down counter/register 184 have had time to settle (i.e., the voltage on output 150 and output 176 are essentially zero volts). Note that the present invention is not limited to any particular scheme for determining the pull-up array and pull-down array impedance.

Figure 1:
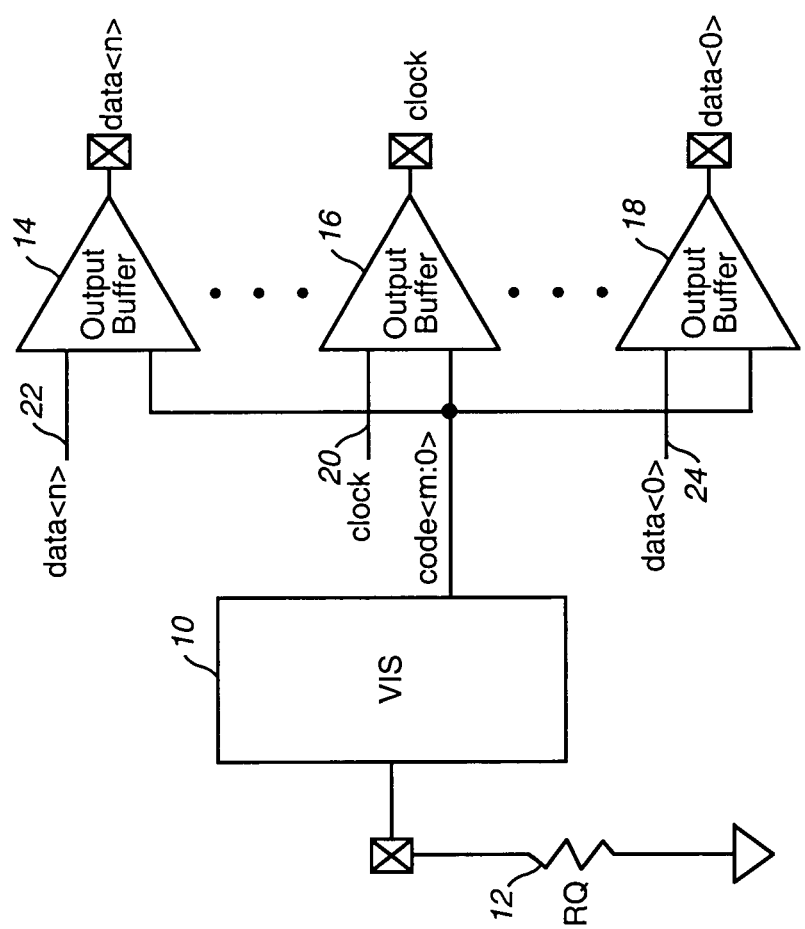
FIG. 1 is a block diagram of a prior art impedance matching circuit.
Figure 6:
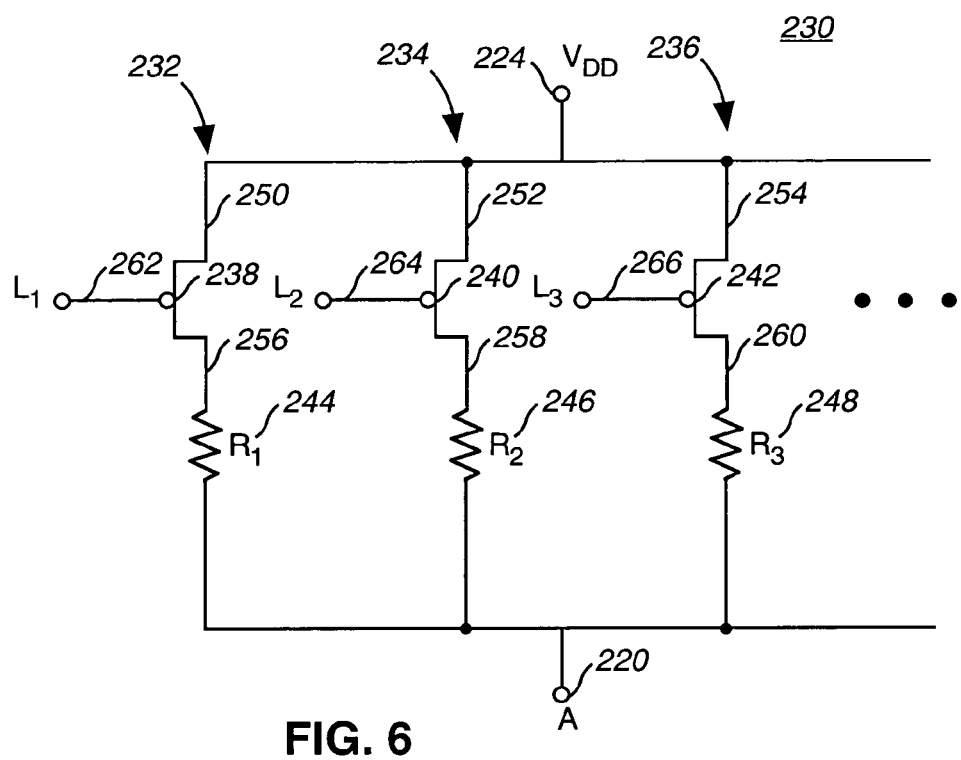
FIG. 6 is a circuit diagram of a pull-up array in accordance with one embodiment of the invention.

FIG. 6 is a circuit diagram of a pull-up array 230 in accordance with one embodiment of the invention. The pull-up array has a number of fingers 232, 234, 236 of which only three are shown. Each finger consists of a p-type transistor 238, 240, 242 in series with a resistor or impedance 244, 246, 248. The sources 250, 252, 254 are connected to the power supply voltage (VDD) 224. The drains 256, 258, 260 are coupled to the resistors 244, 246, 248 respectively. The other terminal of the resistors 244, 246, 248 is coupled to node A 220 (In FIG. 1 left side). Each of the legs 232, 234, 236 are activated by the pull-up register 154 placing a low voltage on the gates (L1, L2, L3) 262, 264, 266. As a result, if the signal L1 262 is low, transistor 238 is on and current flows through resistor 244. In this way the impedance of the pull-up array 230 is varied.

Figure 7:
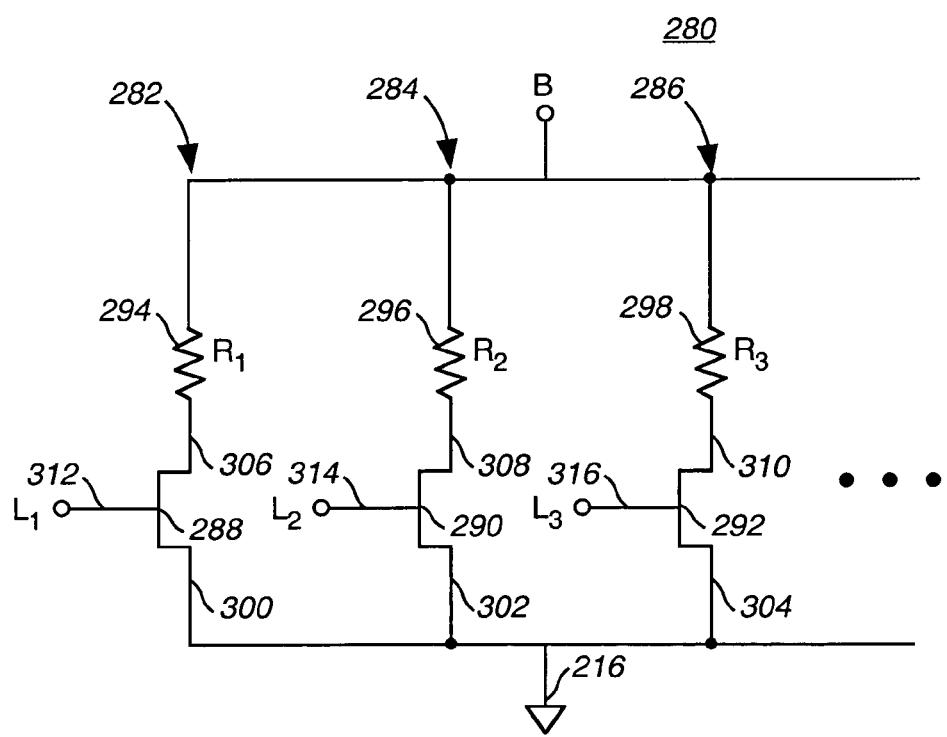
FIG. 7 is a circuit diagram of a pull-down array in accordance with one embodiment of the invention.

FIG. 7 is a circuit diagram of a pull-down array 280 in accordance with one embodiment of the invention. The pull-down array has a number of fingers 282, 284, 286 of which only three are shown. Each finger consists of an n-type transistor 288, 290, 292 in series with a resistor or impedance 294, 296, 298. The sources 300, 302, 304 are connected to the ground 216. The drains 306, 308, 310 are coupled to the resistors 294, 296, 298 respectively. The other terminal of the resistors 294, 296, 298 is coupled to node B. Each of the legs 282, 284, 286 are activated by the pull-down register 182 placing a high voltage on the gates (L1, L2, L3) 312, 314, 316. As a result, if the signal L1 312 is high, transistor 288 is on and current flows through resistor 294. In this way the impedance of the pull-down array 280 is varied.

Figure 8:
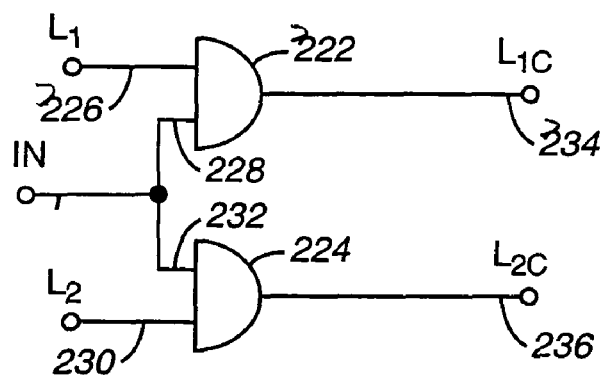
FIG. 8 is a circuit diagram of a pull-down predriver in accordance with one embodiment of the invention.

FIG. 8 is a circuit diagram of a pull-down predriver 320 in accordance with one embodiment of the invention. The predriver 320 has a number of AND gates 322, 324 of which only two are shown. AND gate 322 has a first input 326 coupled to the bit 1 or leg one output of a pull-down register. The other input 328 is coupled to an input signal. AND gate 324 has a first input 330 coupled to the bit 2 or leg two output of the pull-down register. The other input 332 is coupled to the input signal. The output 334 of AND gate 322 forms the input to a first leg of the pull-down array of the driver circuit. The output 336 of AND gate 324 forms the input to a second leg of the pull-down array of the driver circuit.

Figure 9:
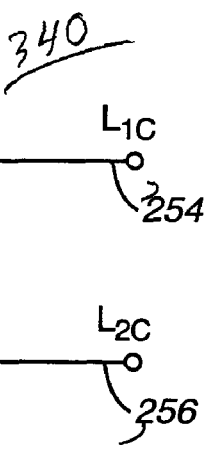
FIG. 9 is a circuit diagram of a pull-up predriver in accordance with one embodiment of the invention.

FIG. 9 is a circuit diagram of a pull-up predriver 340 in accordance with one embodiment of the invention. The predriver 340 has a number of OR gates 342, 344 of which only two are shown. OR gate 342 has a first input 346 coupled to the bit 1 or leg one output of a pull-up register. The other input 348 is coupled to the input signal. OR gate 344 has a first input 350 coupled to the bit 2 or leg two output of the pull-up register. The other input 352 is coupled to the input signal. The output 354 of OR gate 342 forms the input to a first leg of the pull-up array of the driver circuit. The output 356 of OR gate 344 forms the input to a second leg of the pull-up array of the driver circuit.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. An impedance matching circuit, comprising:
   a plurality of buffers each having a variable impedance circuit;
   a variable impedance sense control block having an impedance code output as an output; and
   a sequencing circuit including a delay element and a flip flop having a clocking input coupled to the delay element, the sequencing circuit coupling the impedance code output of the variable impedance sense control block to the variable impedance circuit of each of the plurality of buffers wherein a plurality of fractional legs codes are updated in a predefined order comprising a largest fractional bit first, at least one integral bit second, and a smallest fractional bit last.

2. The circuit of claim 1, wherein the plurality of buffers include a data buffer and a clock buffer.

3. The circuit of claim 2, wherein the flip flop is configured to transmit a bit of the impedance code.

4. The circuit of claim 1, wherein the sequencing circuit includes a plurality of flip flops coupled to the plurality of buffers.

5. The circuit of claim 1, wherein the variable impedance sense control block has an update pulse signal.

6. A method of operating an impedance matching system, comprising:
   a) sensing an impedance mismatch between a plurality of I/O buffers and a plurality of associated transmission lines and generating an impedance sense code having a plurality of bits; and
   b) after generating the impedance sense code, transferring each of the plurality of bits of the impedance sense code in a specific order to each of the plurality of I/O buffers to at least reduce the impedance mismatch, wherein according to the specific order, a largest bit of the plurality of bits is transferred first.

7. The method of claim 6, wherein the transferring includes transferring the plurality of bits of the impedance sense code to a plurality of flip flops and signaling the plurality of flip flops to transfer the plurality of bits of the impedance sense code in said specific order to the plurality of I/O buffers.

8. The method of claim 7, wherein transferring further includes delaying a signal to transfer to at least one of the plurality of flip flops.

9. The method of claim 7, wherein transferring further includes determining a sequence for signaling each of the plurality of flip flops to transfer an individual bit of the impedance sense code.

10. The method of claim 9, wherein a largest fractional bit flip flop is signaled to transfer first.

11. The method of claim 10, wherein a smallest fractional bit flip flop is signaled to transfer last.

12. An impedance matching circuit, comprising:
    a plurality of buffers each having a variable impedance circuit;
    a reference impedance;
    a variable impedance sense control block to sense an impedance mismatch between the plurality of buffers and the reference impedance, and in response to the impedance mismatch to generate an impedance code output; and
    a sequencing circuit coupling the impedance code output of the variable impedance sense control block to the variable impedance circuit of each of the plurality of buffers wherein a plurality of fractional legs codes are updated in a predefined order comprising a largest fractional bit first, at least one integral bit second, and a smallest fractional bit last, to at least reduce a sensed impedance mismatch, wherein the sequencing circuit includes a delay element and a flip flop having a clocking input coupled to the delay element.

13. The method of claim 6, wherein transferring further comprises:
    transferring an integral largest fraction bit first.

14. The method of claim 13, wherein transferring further comprises transferring a smallest fractional bit last.

15. The method of claim 6, wherein transferring further comprises latching each of the plurality of bits of the impedance sense code and delaying at least one of the plurality of bits of the impedance sense code.

* * * * *